(12) United States Patent
Jung et al.

(10) Patent No.: US 9,171,930 B2
(45) Date of Patent: Oct. 27, 2015

(54) METHOD OF MANUFACTURING SEMICONDUCTOR DEVICE

(71) Applicant: Hyundai Motor Company, Seoul (KR)

(72) Inventors: Youngkyun Jung, Seoul (KR); Dae Hwan Chun, Gyeonggi-do (KR); Kyoung-Kook Hong, Gyeonggi-do (KR); Jong Seok Lee, Gyeonggi-do (KR); Junghee Park, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/143,554

(22) Filed: Dec. 30, 2013

(65) Prior Publication Data
US 2015/0079747 A1    Mar. 19, 2015

(30) Foreign Application Priority Data
Sep. 13, 2013 (KR) .......................... 10-2013-0110671

(51) Int. Cl.
*H01L 21/336* (2006.01)
*H01L 29/66* (2006.01)
*H01L 21/02* (2006.01)

(52) U.S. Cl.
CPC .... *H01L 29/66666* (2013.01); *H01L 21/02104* (2013.01)

(58) Field of Classification Search
CPC ............ H01L 29/1037; H01L 29/7827; H01L 29/66068; H01L 29/66666; H01L 21/302; H01L 21/02104
USPC .......................................... 438/243, 268, 710
See application file for complete search history.

(56) References Cited

U.S. PATENT DOCUMENTS

| | | | |
|---|---|---|---|
| 4,361,887 A * | 11/1982 | Nakamura et al. ............ 372/50.1 |
| 8,586,434 B1 * | 11/2013 | Jung et al. ..................... 438/268 |
| 2003/0162402 A1 * | 8/2003 | Song et al. ..................... 438/710 |
| 2004/0159843 A1 * | 8/2004 | Edmond et al. ................. 257/79 |
| 2007/0004127 A1 * | 1/2007 | Lee ................................. 438/243 |
| 2011/0133211 A1 * | 6/2011 | Malhan et al. .................. 257/77 |
| 2011/0227198 A1 * | 9/2011 | Wunderer et al. ............. 257/615 |

FOREIGN PATENT DOCUMENTS

JP    07-176501 A    7/1995
KR   10-2013-0063089 A    6/2013

* cited by examiner

*Primary Examiner* — Mary Wilczewski
*Assistant Examiner* — James Chin
(74) *Attorney, Agent, or Firm* — Mintz Levin Cohn Ferris Glovsky and Popeo, P.C.; Peter F. Corless

(57) ABSTRACT

A method of manufacturing a semiconductor device may include sequentially forming an n-type epitaxial layer, a p type epitaxial layer, and an n+ region on a first surface of an n+ type silicon carbide substrate; forming a buffer layer on the n+ region; forming a photosensitive film pattern on a part of the buffer layer; etching the buffer layer using the photosensitive film pattern as a mask to form a buffer layer pattern; sequentially forming a first metal layer and a second metal layer which include a first portion and a second portion; removing one or more components to expose a part of the n+ region; and etching the exposed part of the n+ region using the first portion of the first metal layer and the first portion of the second metal layer as masks to form a trench.

10 Claims, 9 Drawing Sheets

METHOD OF MANUFACTURING SEMICONDUCTOR DEVICE

CROSS-REFERENCE TO RELATED APPLICATION

This application claims priority to and the benefit of Korean Patent Application No. 10-2013-0110671 filed in the Korean Intellectual Property Office on Sep. 13, 2013, the entire contents of which are incorporated herein by reference.

BACKGROUND (a) Technical Field

The present disclosure relates to a method of manufacturing a semiconductor device which includes silicon carbide (SiC).

(b) Description of the Related Art

In accordance with trends towards large size and large capacity of an appliance in recent years, it has become necessity for a power semiconductor device to have a high breakdown voltage, a high current, and a high speed switching characteristic.

Accordingly, studies and development on a metal oxide semiconductor field effect transistor (MOSFET) which uses silicon carbide (SiC), instead of a MOSFET using silicon of the related art, are increased. Particularly, development on a vertical trench MOSFET is increased.

In the case of a vertical trench MOSFET, an etching technology which forms a trench to be suitable for a semiconductor substrate is required. Further, silicon carbide is a material having a strong covalent bond, so that a hardness of silicon carbide is higher than that of silicon and an oxidation resistance is stronger than that of silicon. Therefore, a mask which has a higher hardness than silicon carbide is required at the time of etching process in order to overcome etch difficulty.

Therefore, when a trench is formed in a silicon carbide substrate, a metal mask which has a hardness higher than silicon carbide is used. In this case, the metal mask is formed by a lift-off process. However, when the trench is formed using such a metal mask, metal residuals may remain in the trench.

The above information disclosed in this Background section is only for enhancement of understanding of the background of the disclosure, and therefore it may contain information that does not form the related art that is already known in this country to a person of ordinary skill in the art.

SUMMARY

The disclosed embodiments have been made in an effort to provide a method which prevents metal residuals from being generated in a trench in a silicon carbide MOSFET in which a trench gate is applied.

An exemplary embodiment of the present disclosure provides a method of manufacturing a semiconductor device including sequentially forming an n-type epitaxial layer, a p-type epitaxial layer, and an n+ region on a first surface of an n+ type silicon carbide substrate; forming a buffer layer on the n+ region; forming a photosensitive film pattern on a part of the buffer layer; etching the buffer layer using the photosensitive film pattern as a mask to form a buffer layer pattern which is disposed below the photosensitive film pattern and exposes a part of the n+ region; sequentially forming a first metal layer and a second metal layer which include a first portion disposed on the n+ region and a second portion disposed on the photosensitive film pattern on the exposed n+ region and the photosensitive film pattern; removing the buffer layer pattern, the photosensitive film pattern, the second portion of the first metal layer, and the second of the second metal layer to expose a part of the n+ region; and etching the exposed part of the n+ region using the first portion of the first metal layer and the first portion of the second metal layer as masks to form a trench. The trench passes through the n+ region and the p-type epitaxial layer and is formed on the n-type epitaxial layer.

The buffer layer may be formed of any one or more of silicon dioxide, a BPSG, and an HDP oxidation layer. In the forming of a buffer layer pattern, a wet etching process may be performed using a buffered oxide etchant. The buffered oxide etchant may include one or more of ammonium fluoride, hydrofluoric acid, and water. Both ends of the buffer layer pattern may be disposed at inner sides from both ends of the photosensitive film pattern. The first metal layer may be formed of chrome and the second metal layer may be formed of nickel. A thickness of the second metal layer may be larger than a thickness of the first metal layer. The first portion of the first metal layer may be separated from the second portion of the first metal layer and the first portion of the second metal layer may be separated from the second portion of the second metal layer. In the removing of the buffer layer pattern, the photosensitive film pattern, the second portion of the first metal layer, and the second portion of the second metal layer, the buffer layer pattern, the photosensitive film pattern, the second portion of the first metal layer, and the second portion of the second metal layer, may be simultaneously removed by performing a lift-off process.

The method of manufacturing a semiconductor device according to the exemplary embodiment of the present disclosure may further include after the forming of a trench, forming a gate insulating layer in the trench; forming a gate electrode on the gate insulating layer; etching a part of the n+ region and forming an oxidation layer on the gate electrode; and forming a source electrode on the p-type epitaxial layer, the n+ region, and the oxidation layer and forming a drain electrode on a second surface of the n+ type silicon carbide substrate.

According to an exemplary embodiment of the present disclosure, in a silicon carbide MOSFET in which a trench gate is applied, when the trench is formed using a metal mask, a lift-off process is performed using a buffer layer pattern, which may prevent metal residuals from remaining in the trench. Accordingly, when a gate electrode is formed in the trench, a problem may be prevented.

Figure 1:
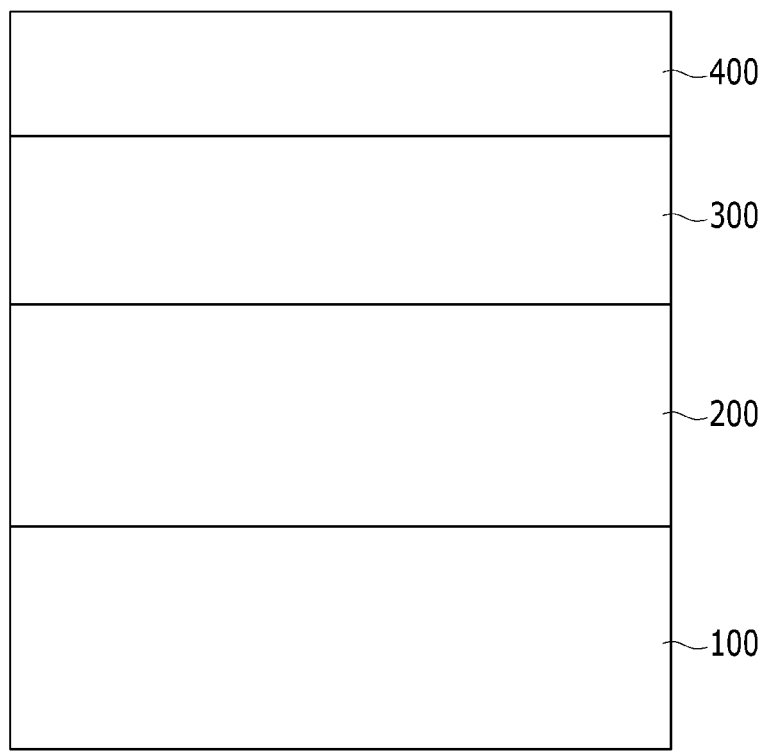
FIGS. 1 to 9 are exemplary schematic diagrams sequentially illustrating a method of manufacturing a semiconductor device according to an exemplary embodiment of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, exemplary embodiments of the present disclosure will be described in detail with reference to the accompanying drawings. As those skilled in the art would realize, the described embodiments may be modified in various different ways, all without departing from the spirit or scope of the present disclosure. On the contrary, exemplary embodiments introduced herein are provided to make disclosed contents thorough and complete and sufficiently transfer the spirit of the present disclosure to those skilled in the art.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In the drawings, the thickness of layers, films, panels, regions, etc., are exaggerated for clarity. It will be understood that when a layer is referred to as being "on" another layer or substrate, it can be directly on the other layer or substrate, or an intervening layer may also be present. Like reference numerals designate like elements throughout the specification.

Additionally, it is understood that the below methods may be executed by at least one control unit. The term "control unit" refers to a hardware device that includes a memory and a processor. The memory is configured to store program instructions, and the processor is configured to execute the program instructions to perform one or more processes which are described further below. Moreover, it is understood that the below methods may be executed by an apparatus comprising the control unit, whereby the apparatus is known in the art to be suitable for semiconductor device manufacturing.

Hereinafter, a method of manufacturing a semiconductor device according to an exemplary embodiment of the present disclosure will be described in detail with reference to FIGS. 1 to 9.

FIGS. 1 to 9 are exemplary schematic diagrams sequentially illustrating a method of manufacturing a semiconductor device according to an exemplary embodiment of the present disclosure.

Referring to FIG. 1, an n+ type silicon carbide substrate 100 is prepared, an n-type epitaxial layer 200 is formed on a first surface of the n+ type silicon carbide substrate 100 by first epitaxial growth, a p-type epitaxial layer 300 is formed on the n-type epitaxial layer 200 by second epitaxial growth, and an n+ region 400 is formed on the p-type epitaxial layer 300 by third epitaxial growth. In the present exemplary embodiment, the n+ region 400 is formed by the third epitaxial growth, but the n+ region 400 may be formed by injecting n+ ions in a part of a surface of the p-type epitaxial layer 300 without performing the epitaxial growth.

Figure 2:
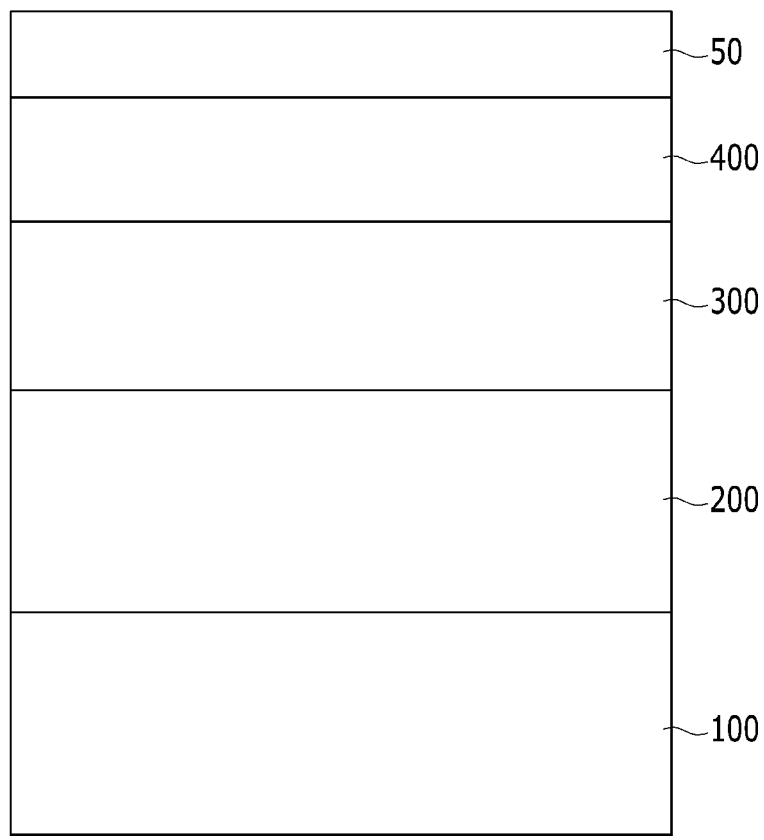

Referring to FIG. 2, a buffer layer 50 is formed on the n+ region 400. The buffer layer 50 may be formed of any one or more of silicon dioxide ($SiO_2$), a boron phosphorus silicate glass (BPSG) and a high density plasma (HDP) oxidation layer.

Figure 3:
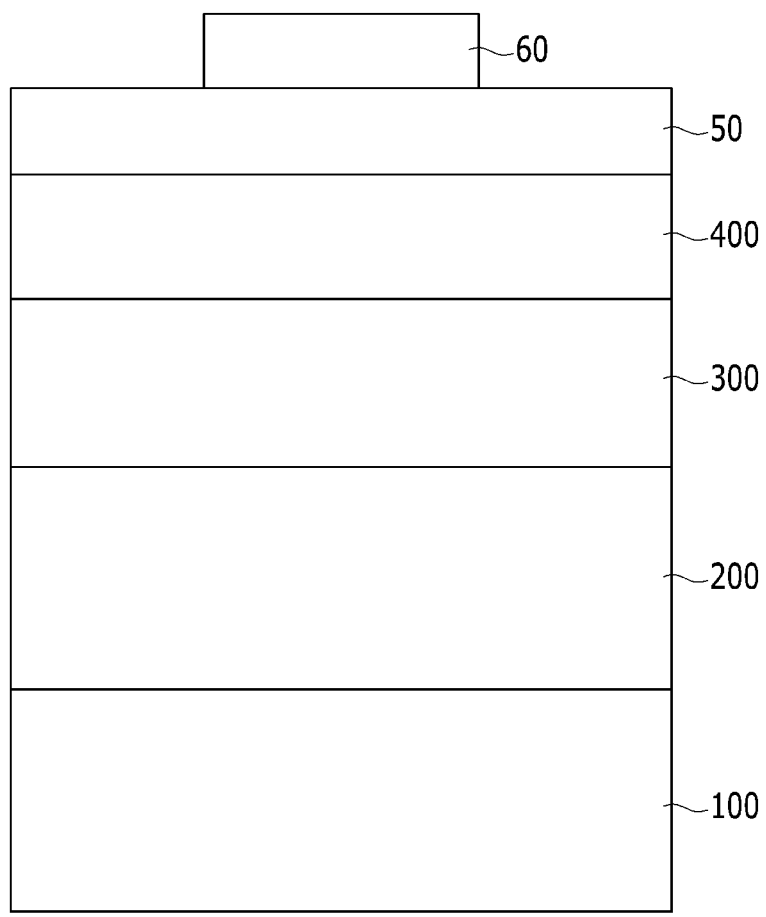

Referring to FIG. 3, a photosensitive film pattern 60 is formed on a part of the buffer layer 50. Here, the photosensitive film pattern 60 is formed in a portion where a trench 450, which will be described below, is formed.

Figure 4:
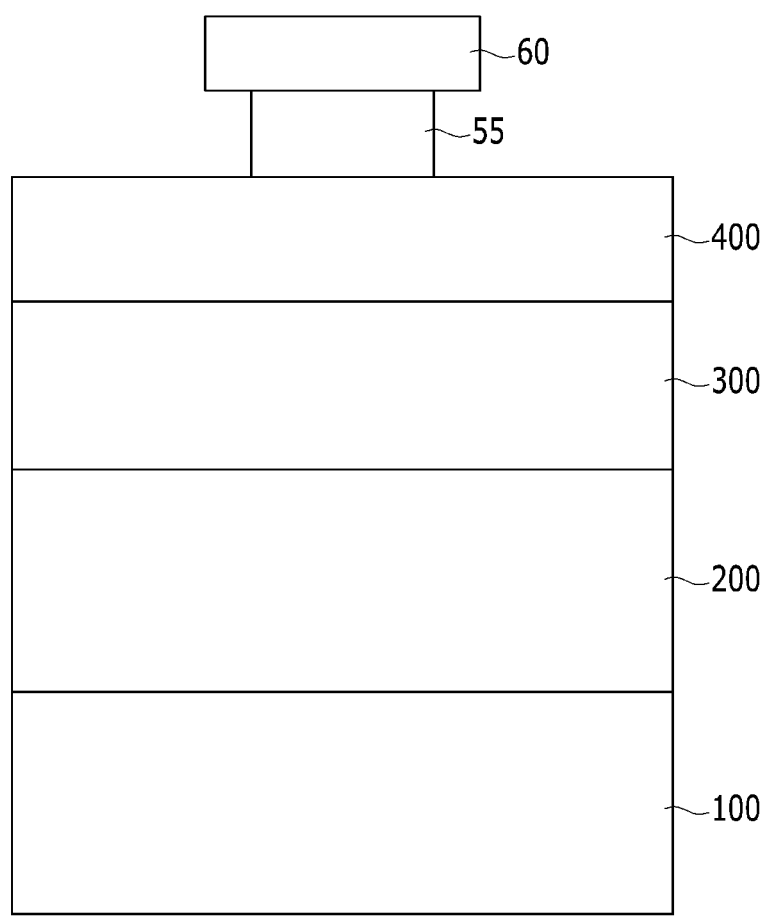

Referring to FIG. 4, the buffer layer 50 is etched using the photosensitive film pattern 60 as a mask to form a buffer layer pattern 55 below the photosensitive film pattern 60. Here, as the etching process, a wet etching process may be performed using a buffered oxide etchant (BOE). The buffered oxide etchant may include one or more of ammonium fluoride ($NH_4F$), hydrofluoric acid (HF), and water.

By the etching process, a part of the buffer layer 50 which is exposed by the photosensitive film pattern 60 is removed. Therefore, a part of the n+ region 400 is exposed by the buffer layer pattern 55. Further, a portion of the buffer layer 50 which is disposed below the photosensitive film pattern 60 is etched up to inner sides of both ends of the photosensitive film pattern 60. Therefore, both ends of the buffer layer pattern 55 are disposed at inner sides from the both ends of the photosensitive film pattern 60, respectively.

Figure 5:
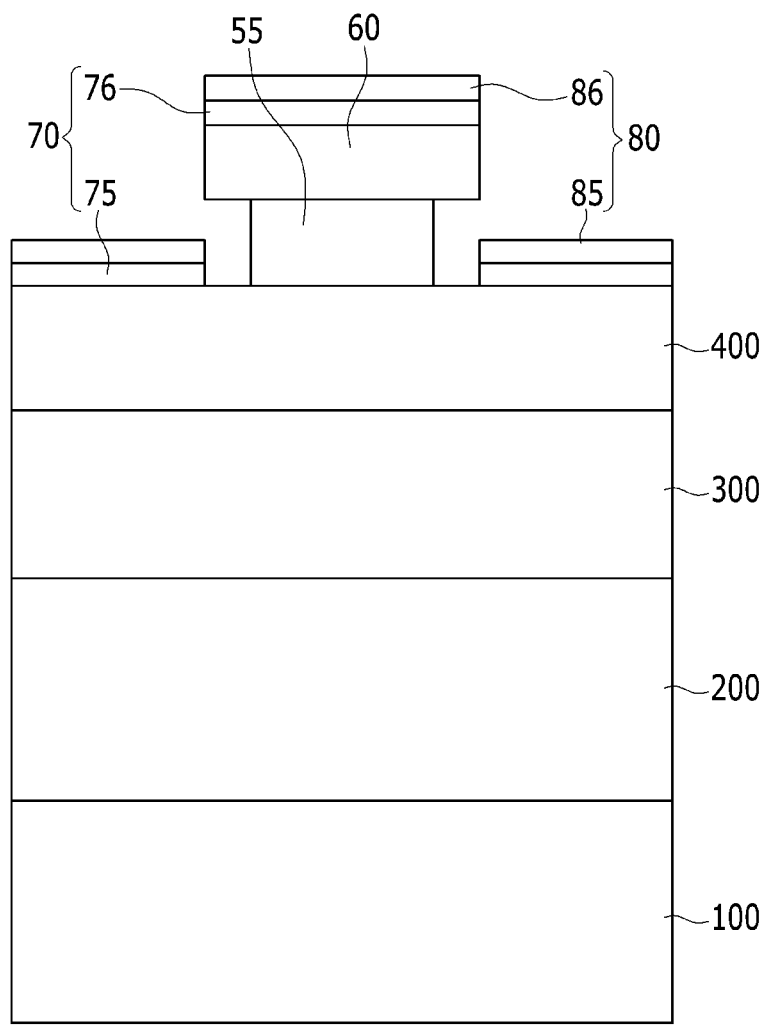

Referring to FIG. 5, a first metal layer 70 and a second metal layer 80 are sequentially formed on the exposed n+ region 400 and the photosensitive film pattern 60. The first metal layer 70 includes a first portion 75 which is disposed on the n+ region 400 and a second portion 76 which is disposed on the photosensitive film pattern 60. The second metal layer 80 includes a first portion 85 which is disposed on the n+ region 400 and a second portion 86 which is disposed on the photosensitive film pattern 60.

The first portion 75 of the first metal layer 70 and the second portion 76 of the first metal layer 70 are not connected to each other but separated from each other with the photosensitive film pattern 60 and the buffer layer pattern 55 which is disposed below the photosensitive film pattern 60 therebetween. Similarly, the first portion 85 of the second metal layer 80 and the second portion 86 of the second metal layer 80 are not connected to each other but separated from each other. Here, the first metal layer 70 may be formed of chrome (Cr). Further, the second metal layer 80 may be formed of nickel (Ni). A thickness of the first metal layer 70 may be approximately 50 nm and a thickness of the second metal layer 80 may be approximately 150 nm.

Figure 6:
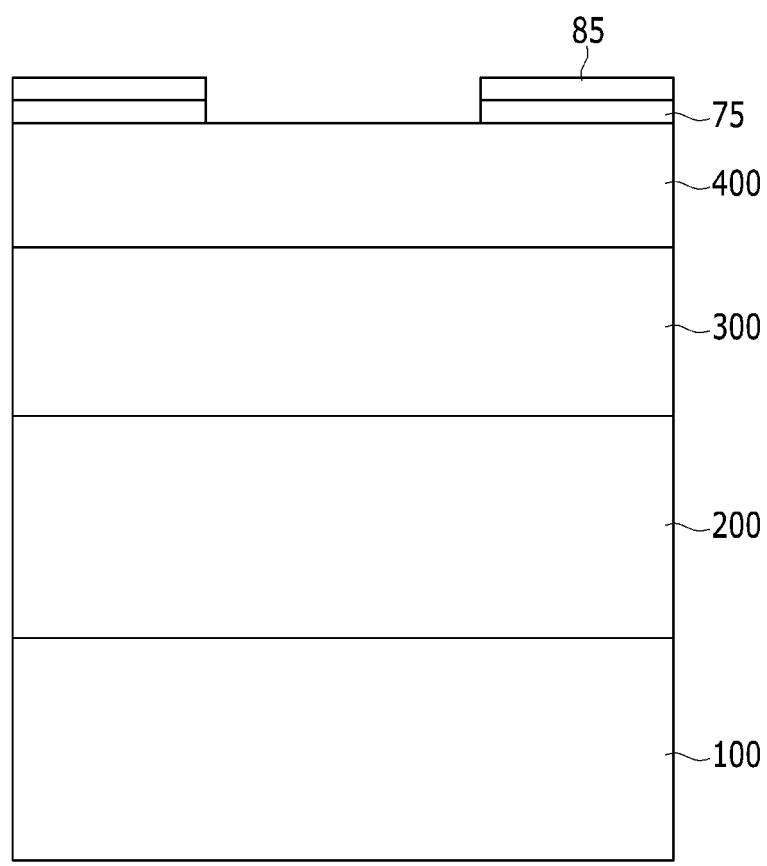

Referring to FIG. 6, the buffer layer pattern 55 is removed. Here, the buffer layer pattern 55 is removed by performing a lift-off process. When the buffer layer pattern 55 is removed, the photosensitive film pattern 60 which is disposed on the buffer layer pattern 55, the second portion 76 of the first metal layer 70, and the second portion 86 of the second metal layer 80 are simultaneously removed. Accordingly, the first portion 75 of the first metal layer 70 and the first portion 85 of the second metal layer 80 remain, and the first portion 75 of the first metal layer 70 and the first portion 85 of the second metal layer 80 expose a part of the n+ region 400.

Due to the buffer layer pattern 55 which is disposed below the photosensitive film pattern 60, the first portion 75 of the first metal layer 70 and the second portion 76 of the first metal layer 70 are separated from each other, and the first portion 85 of the second metal layer 80 and the second portion 86 of the second metal layer 80 are separated from each other, so that residuals of the second portion 76 of the first metal layer 70 and the second portion 86 of the second metal layer 80 do not remain during the removal by the lift-off process.

Figure 7:
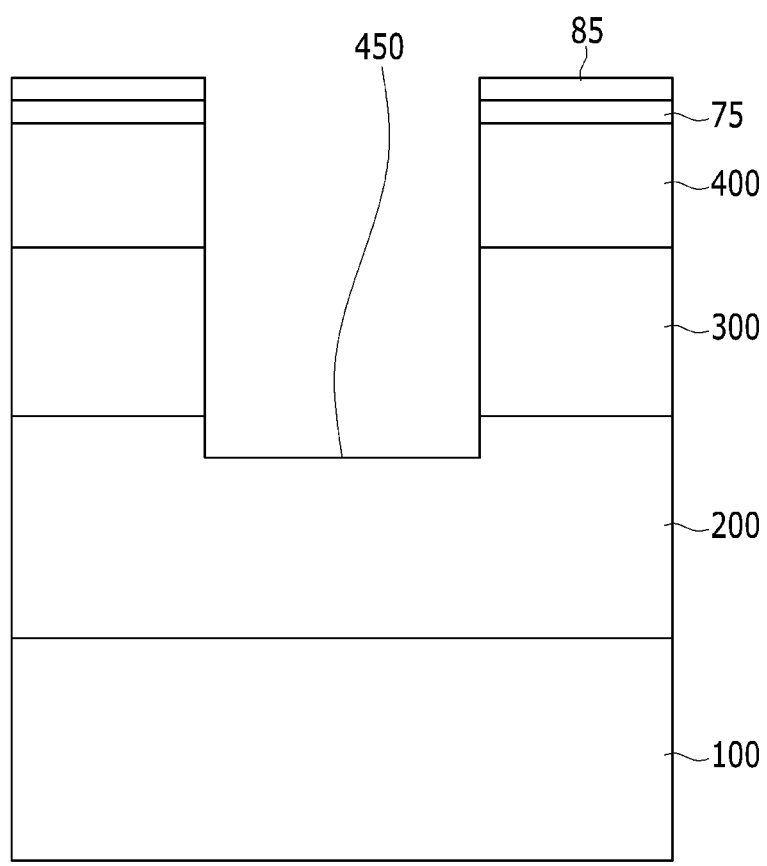

Referring to FIG. 7, the exposed n+ region 400 is etched using the first portion 75 of the first metal layer 70 and the first portion 85 of the second metal layer 80 as masks to form a trench 450. Here, a dry etching process may be performed as the etching process. The trench 450 passes through the n+ region 400 and the p-type epitaxial layer 300 and is formed on the n-type epitaxial layer 200.

Figure 8:
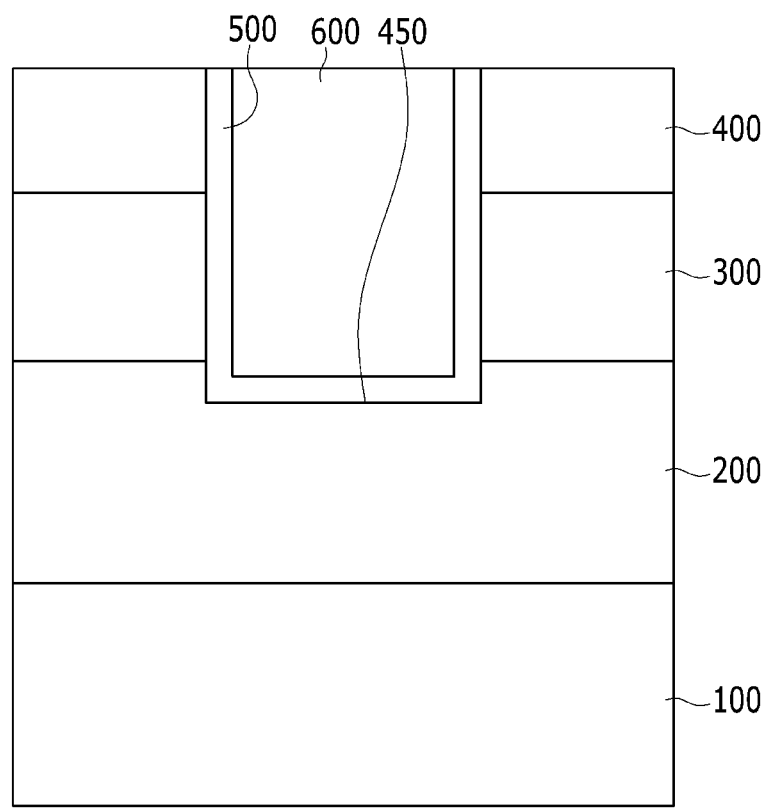

Referring to FIG. 8, after removing the first portion 75 of the first metal layer 70 and the first portion 85 of the second metal layer 80, a gate insulating layer 500 is formed in the trench 450, and a gate electrode 600 is formed on the gate insulating layer 500. The gate electrode 600 fills the trench 450.

Figure 9:
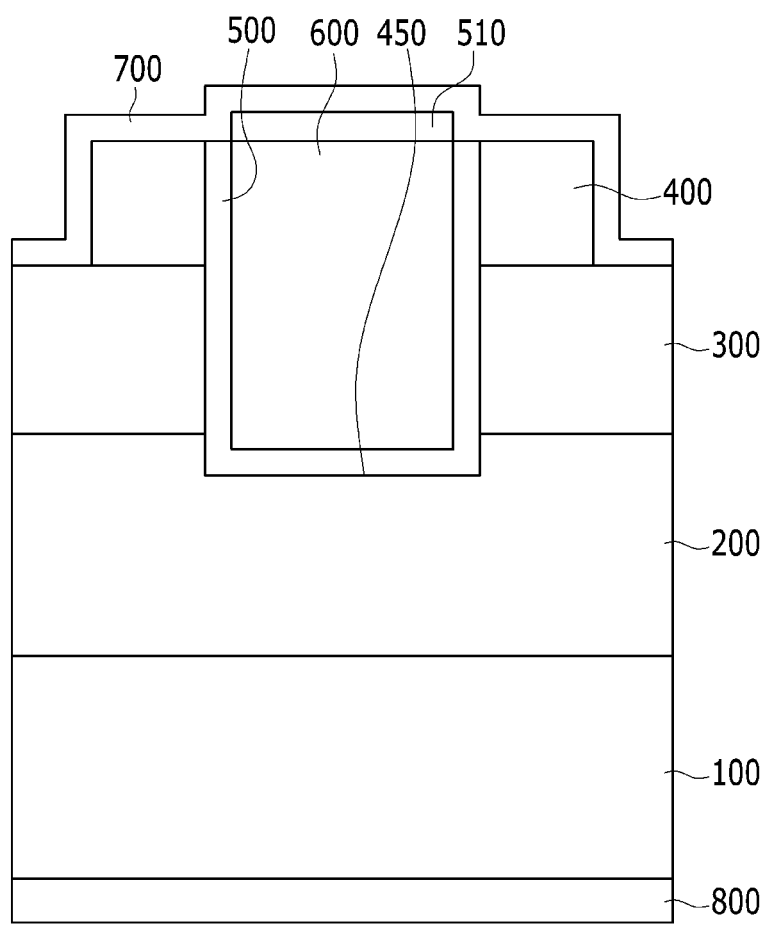

Referring to FIG. 9, a part of the n+ region 400 is etched, and an oxidation layer 510 is formed on the gate electrode 600. A part of the p-type epitaxial layer 300 is exposed by etching a part of the n+ region 400. Next, a source electrode 700 is formed on the exposed part of the p-type epitaxial layer 300, the n+ region 400, and the oxidation layer 510, and a drain electrode 800 is formed on a second surface of the n+ type silicon carbide substrate 100.

The semiconductor device is completed by such a manufacturing method. The semiconductor device which is formed by the manufacturing method according to the present exemplary embodiment may be a silicon carbide MOSFET in which a trench gate is applied.

As described above, when the trench 450 is formed using the metal layer as a mask, a metal layer which is not used as a mask is removed by the lift-off process. However, as described in the present exemplary embodiment, the buffer layer pattern 55 is used at the time of the lift-off process, so that the metal layer which is disposed on the buffer layer pattern 55 is removed without having residuals. Therefore, it is possible to prevent metal residuals from being formed in the trench 450. As a result, a problem may not occur when the gate electrode 600 is formed in the trench 450.

While this invention has been described in connection with what is presently considered to be practical exemplary embodiments, it is to be understood that the scope of the disclosure is not limited to the disclosed embodiments, but, on the contrary, is intended to cover various modifications and equivalent arrangements included within the spirit and scope of the appended claims.

<Description of symbols>

| | |
|---|---|
| 50: Buffer layer | 55: Buffer layer pattern |
| 60: Photosensitive film pattern | 70: First metal layer |
| 80: Second metal layer | 100: n+ type silicon carbide substrate |
| 200: n− type epitaxial layer | 300: p− type epitaxial layer |
| 400: n+ region | 450: Trench |
| 500: Gate insulating layer | 510: Oxidation layer |
| 600: Gate electrode | 700: Source electrode |
| 800: Drain electrode | |

What is claimed is:

1. A method of manufacturing a semiconductor device, comprising:
   sequentially forming an n-type epitaxial layer, a p-type epitaxial layer, and an n+ region on a first surface of an n+ type silicon carbide substrate;
   forming a buffer layer on the n+ region;
   forming a photosensitive film pattern on a part of the buffer layer;
   etching the buffer layer using the photosensitive film pattern as a mask to form a buffer layer pattern which is disposed below the photosensitive film pattern and exposes a part of the n+ region;
   sequentially forming a first metal layer and a second metal layer which both include first portions disposed on the n+ region and second portions disposed on the photosensitive film pattern on the exposed part of the n+ region and the photosensitive film pattern;
   removing the buffer layer pattern, the photosensitive film pattern, the second portion of the first metal layer, and the second portion of the second metal layer to expose the part of the n+ region; and
   etching the exposed part of the n+ region using the first portion of the first metal layer and the first portion of the second metal layer as masks to form a trench,
   wherein the trench passes through the n+ region and the p-type epitaxial layer and is formed on the n-type epitaxial layer.

2. The method of claim 1, wherein the buffer layer is formed of any one or more of silicon dioxide, a BPSG, and an HDP oxidation layer.

3. The method of claim 2, wherein in the forming of the buffer layer pattern, a wet etching process is performed using a buffered oxide etchant.

4. The method of claim 3, wherein the buffered oxide etchant includes one or more of ammonium fluoride, hydrofluoric acid, and water.

5. The method of claim 4, wherein both ends of the buffer layer pattern are disposed at inner sides from both ends of the photosensitive film pattern.

6. The method of claim 5, wherein the first metal layer is formed of chrome and the second metal layer is formed of nickel.

7. The method of claim 6, wherein a thickness of the second metal layer is greater than a thickness of the first metal layer.

8. The method of claim 7, wherein the first portion of the first metal layer is separated from the second portion of the first metal layer, and
   the first portion of the second metal layer is separated from the second portion of the second metal layer.

9. The method of claim 8, wherein in the removing of the buffer layer pattern, the photosensitive film pattern, the second portion of the first metal layer, and the second portion of the second metal layer,
   the buffer layer pattern, the photosensitive film pattern, the second portion of the first metal layer, and the second portion of the second metal layer are simultaneously removed by performing a lift-off process.

10. The method of claim 1, further comprising:
    after the forming of the trench,
    forming a gate insulating layer in the trench;
    forming a gate electrode on the gate insulating layer;
    etching a part of the n+ region and forming an oxidation layer on the gate electrode; and
    forming a source electrode on the p-type epitaxial layer, the n+ region, and the oxidation layer and forming a drain electrode on a second surface of the n+ type silicon carbide substrate.

* * * * *